United States Patent [19]

Pankove et al.

[11] Patent Number: 4,473,597

[45] Date of Patent: Sep. 25, 1984

[54] METHOD AND STRUCTURE FOR PASSIVATING A PN JUNCTION

[75] Inventors: Jacques I. Pankove, Princeton; Ming L. Tarng, Mercerville, both of N.J.

[73] Assignee: RCA Corporation, New York, N.Y.

[21] Appl. No.: 463,166

[22] Filed: Feb. 2, 1983

Related U.S. Application Data

[62] Division of Ser. No. 874,248, Feb. 1, 1978, abandoned.

[51] Int. Cl.³ .......................................... H01L 21/314
[52] U.S. Cl. ........................................ 427/39; 357/52; 427/86; 427/87; 427/95
[58] Field of Search ................ 427/86, 95, 39, 87; 357/52

[56] References Cited

U.S. PATENT DOCUMENTS

| | | | |
|---|---|---|---|
| 3,743,847 | 7/1973 | Boland | 250/510 |
| 3,806,361 | 4/1974 | Lehner | 117/212 |
| 3,971,061 | 7/1976 | Matsushita et al. | 357/52 |
| 4,001,873 | 1/1977 | Kajiwara et al. | 357/59 |
| 4,064,521 | 12/1977 | Carlson | 357/2 |
| 4,084,986 | 4/1978 | Aoki et al. | 148/1.5 |
| 4,109,271 | 8/1978 | Pankove | 357/30 |
| 4,113,514 | 9/1978 | Pankove et al. | 148/1.5 |
| 4,134,125 | 1/1979 | Adams | 357/52 |
| 4,362,766 | 12/1982 | Dannhauser et al. | 427/39 |

OTHER PUBLICATIONS

Fritzsche et al., "Amorphous Semiconducting Silicon-Hydrogen Alloys" Solid State Technology/-Jan. 1978, pp. 55-60.

Chittick et al., "The Preparation and Properties of Amorphous Silicon" Journal Electrochemical Society: Solid State Science, vol. 116, No. 1, Jan. 1969, pp. 77-81.

Photoluminescence of Hydrogenated Amorphous Silicon, Applied Physics Letters, vol. 31, No. 7, Oct. 1, 1977, pp. 450-451.

Primary Examiner—John D. Smith
Attorney, Agent, or Firm—Birgit E. Morris; Donald S. Cohen

[57] ABSTRACT

A technique for passivating a PN junction adjacent a surface of a semiconductor substrate comprises coating the area of the surface adjacent the PN junction with a layer of hydrogenated amorphous silicon containing between about 5 and about 50 atomic percent of hydrogen.

8 Claims, 4 Drawing Figures

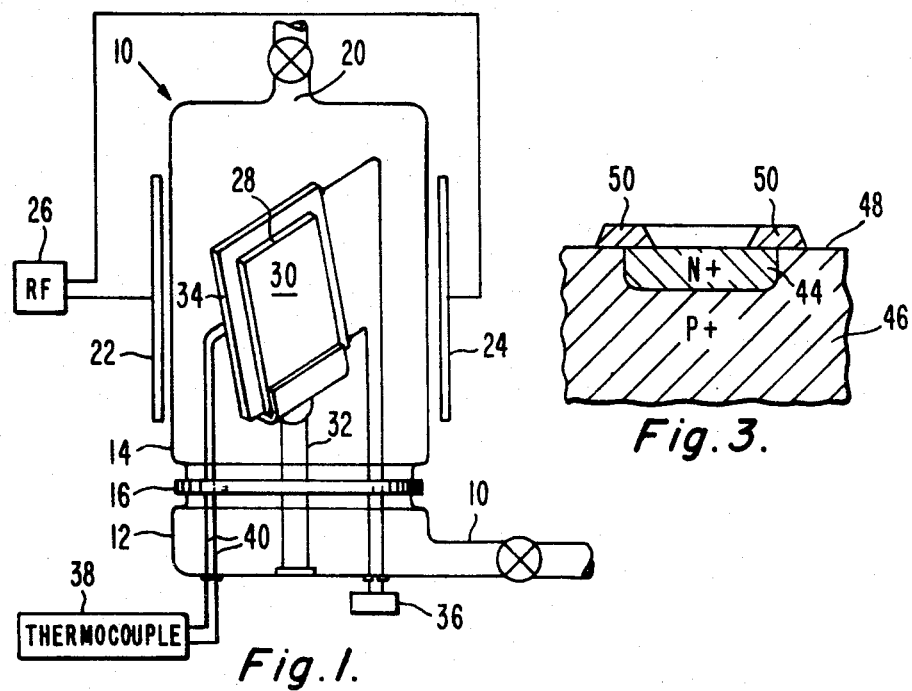
Fig. 1.
Fig. 3.
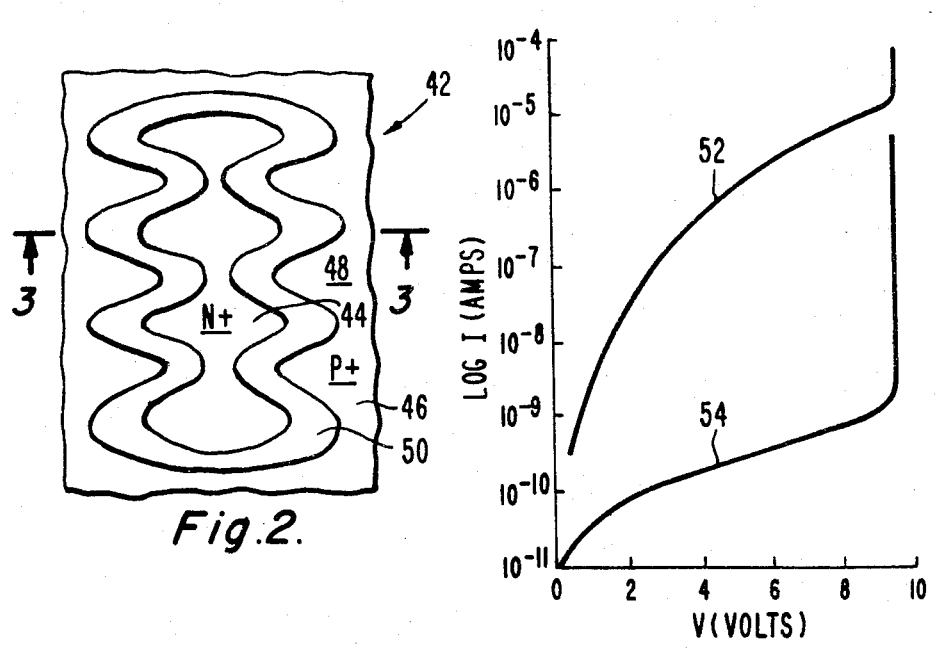
Fig. 2.
Fig. 4.

METHOD AND STRUCTURE FOR PASSIVATING A PN JUNCTION

This is a division of application Ser. No. 874,248, filed Feb. 1, 1978, now abandoned.

This invention relates to a method and structure for passivating a PN junction adjacent a surface of a semiconductor substrate in order to reduce the undesirable effects of recombination/generation centers on the leakage current and breakdown-voltage characteristics, and also to improve the bias-temperature stability and operating life expectancy of the PN junction.

The operating performance of a PN junction adjacent the surface of a semiconductor substrate is frequently degraded by the generation of unwanted charge carriers, thereby increasing the leakage current and lowering the breakdown voltage. From the early history of germanium and silicon single-crystal semiconductor physics, it is known that such semiconductor material contains dangling bonds which potent minority-carrier lifetime killers. These dangling bonds are responsible for states in the energy gap which, for a reverse-biased PN junction, generate unwanted charge carriers. Dangling bonds occur primarily at the surface of the device and are responsible for the so-called "surface recombination". Dangling bonds also occur at vacancies, micropores, disclocations, and are associated with certain impurities.

We have recently observed that the formation of amorphous silicon (a-Si) by the glow-discharge decomposition of silane results in a hydrogen-rich material. A method of depositing a body of amorphous silicon on a substrate in a glow-discharge apparatus is described in U.S. Pat. No. 4,064,521, which issued to D. E. Carlson on Dec. 20, 1977 and is assigned to RCA Corporation. We have determined that a-Si produced by the glow-discharge decomposition of silane may contain between about 5 to about 50 atomic percent of hydrogen. Most of this hydrogen is believed to be valence-bonded to silicon atoms in the amorphous network as Si—H bonds. Heating the hydrogenated a—Si in vacuum causes a measurable evolution of hydrogen. When a—Si:H is thermally dehydrogenated, the residue is in the form of Si which is extremely rich in dangling bonds. With this in mind, we have correlated the decreasing photoluminescence efficiency of a—Si:H with hydrogen evolution during annealing, suggesting that the dangling bonds left in the material by the outgassing of hydrogen are effective sites for non-radiative recombination, as they are in single-crystal Si.

The present invention provides a technique for neutralizing the dangling bonds at a PN junction adjacent the surface of a semiconductor substrate, thereby passivating the PN junction by reducing the number of recombination/generation centers adjacent the PN junction. This technique reduces significantly the leakage current across the PN junction when reverse-biased "sharpens" considerably the breakdown-voltage curve, and improves the operational life expectancy of the PN junction.

In the drawings:

FIG. 1 is a diagrammatic view illustrating one embodiment of an apparatus utilized to perform the present novel method.

FIG. 2 is a plan view of a semiconductor substrate having a PN junction passivated in accordance with the present novel invention.

FIG. 3 is a cross-sectional view taken along line 3—3 of FIG. 2.

FIG. 4 is a diagram of the I–V characteristics of an array of reverse-biased PN junctions in crystalline Si before and after passivation in accordance with the present novel invention.

Referring to FIG. 1 of the drawings, there is shown an apparatus which we utilized for carrying out the present novel passivation method. The apparatus comprises an evacuation chamber 10 which includes two glass enclosures 12 and 14 joined together with a flange 16. The chamber 10 is evacuated by means of a first opening 18 in the bottom enclosure 12 which is connected to a mechanical pumping system (not shown). A second opening 20 in the top enclosure 14 is connected to a gas bleed-in system (not shown) which provides a source of silane ($SiH_4$) for the chamber 10. On opposite sides of the chamber 10 are two electrodes 22 and 24 connected to an rf generator 26 for developing a glow discharge across the center of the chamber 10.

A crystalline semiconductor substrate 28 having a PN junction adjacent a surface 30 thereof is supported on a pedestal 32 in the center of the chamber 10, as illustrated in FIG. 1. The substrate 28 is supported in an upright position in order to provide maximum exposure of the surface 30 to the glow discharge. Adjacent to a side of the substrate opposite the PN junction surface 30 is disposed a heating plate 34, typically a ceramic plate which coated with a serpentine resistance that is energized from a current source 36 external to the evacuation chamber 10. A thermocouple 38 is utilized to monitor the temperature of the substrate 28 by attaching leads 40 thereto through a hole (not shown) in the back of the heating plate 34.

The first step of the present method is to evacuate the chamber 10 to a pressure of between about $10^{-3}$ Torr and about $10^{-6}$ Torr, while heating the substrate 28 to a temperature below about 450° C. In the present embodiment, the substrate 28 was maintained at a temperature of approximately 350° C.

Silane ($SiH_4$) is next introduced into the chamber 10 through the second opening 20 to a pressure between about 0.1 Torr and about 5 Torr; in the present example, the $SiH_4$ pressure was maintained at a pressure of approximately 0.5 Torr.

The silane ($SiH_4$) within the chamber 10 is now subjected to a glow discharge between the electrodes 22 and 24 by energizing the rf generator 26. In the present embodiment, we operated the rf generator 26 at 900 kHz and 1.5 kV, for a power output of about 1 kW. Although, in the present example, the glow discharge is induced by a capacitively-coupled rf system, the glow discharge may also be generated by either high-voltage DC or AC, i.e., in the low-frequency range on the order of 60 Hertz. The rf generator may also be inductively-coupled to the low-pressure silane ($SiH_4$). Once the glow discharge is initiated, the silane molecules decompose; the glow discharge both ionizes and disassociates the $SiH_4$ molecules. The positive silicon ions and the positive silicon hydride ions, such as $SiH^{+1}$, $SiH_2^{+2}$, and $SiH_3^{+3}$, deposite adjacent the surface 30 of the silicon substrate 28, forming a layer (not shown in FIG. 1) of hydrogenated amorphous silicon. We have conducted tests which show that such layers contain between about 5 and about 50 atomic percent of hydrogen. Consequently, a hydrogenated amorphous silicon layer means an amorphous silicon layer which contains a significant amount of hydrogen therein. Preferably, the thickness of the deposited amorphous-silicon layer ranges from about 0.01 micrometer to about 1 micrometer. The apparatus used for coating the surface 30 of the substrate 28 with the layer of hydrogenated amorphous silicon is not limited to that disclosed in FIG. 1 but may include any other glow-discharge apparatus used for depositing amorphous silicon, such as the embodiments described in the above-mentioned patent issued to D. E. Carlson. The hydrogenated amorphous silicon may also be deposited by sputtering silicon in the presence of hydrogen.

We have discovered that coating the PN junction surface 30 of the substrate 28 with such a layer of hydrogenated amorphous silicon has a passivating effect on the PN junction. We believe that the presence of a significant amount of hydrogen in the overlying amorphous silicon layer has a beneficial effect on the electrical properties of the underlying PN junction. In order to determine the effectiveness of the present method of passivating a PN junction, we conducted experiments on arrays of PN junctions which were tested before and after passivation with a hydrogenated amorphous silicon layer.

Referring to FIGS. 2 and 3, an array 42 of PN junctions (only one junction is illustrated) was fabricated by diffusing several N+ regions 44 into a P+ crystalline silicon substrate 46 adjacent to a surface 48 thereof. A thermal silicon dioxide layer (not shown) which is grown adjacent the surface 48 during this junction-forming process was next removed by a standard etching treatment. The surface 48 of the substrate 46 was then cleaned utilizing conventionally-known cleaning fluids and baked dry at about 200° C. in nitrogen. Next a layer of hydrogenated amorphous silicon containing between about 5 and 50 atomic percent of hydrogen was deposited on the surface 48 in accordance with the above-described method. This amorphous silicon layer was deposited at 350° C. at a pressure of about 0.95 Torr for approximately 10 minutes in an rf coupled system as explained above. Using conventional photolithographic techniques known in the art, portions of the amorphous silicon layer overlying the PN junctions were masked with a photoresist and the exposed portions were then etched in a hot dilute solution of KOH, which opened up contact areas for the substrate 46. After removing the photoresist, the resulting structure comprised a patterned layer 50 of the amorphous silicon which coated only the areas of the surface 48 adjacent the PN junctions, as shown in FIGS. 2 and 3. Using standard techniques, electrical contacts (not shown) were made to the fabricated array 42 of diodes.

The array 42 of diodes were tested before the present passivation treatment, i.e., with only the thermally-grown silicon dioxide thereon, and after being passivated with the patterned layer 50 of hydrogenated amorphous silicon. The results of such testing are illustrated in FIG. 4, where the top curve 52 shows the I(V) reverse-current characteristics for the PN junctions passivated with thermally-grown SiO$_2$, and where the bottom curve 54 shows the I(V) results of the PN junctions after being coated with the patterned layer 50 of hydrogenated amorphous silicon in accordance with the present invention. The bottom curve 54 does not start to shoot upwards until a potential of about 8.5 volts, while the top curve 52 starts to move upward immediately at about a 1 volt potential, indicating a substantial amount of current leakage. This novel passivation technique has reduced the leakage current by approximately 4 orders of magnitude, and the breakdown-voltage curve has considerably "sharpened". We believe that this unexpected result is attributable to the presence of a significant amount of hydrogen in the overlying layer 50 of amorphous silicon. We believe that this overlying layer 50 is capable of supplying atomic hydrogen for neutralizing dangling bonds existing at the surface 48 of the underlying substrate 46 by providing hydrogen atoms which attach to the dangling bonds. The H atoms bond to a dangling orbital at each surface Si atom to form one or more of the silicon hydride phases selected from the group consisting of Si:H, Si:H$_2$, and Si:H$_3$. In addition, the hydrogen atoms in the bulk of the overlying layer 50 continue to rehydrogenate the semiconductor surface 48 during operation of the PN junction and thereby considerably lengthen the life expectancy of the PN junction. The degradation of a PN junction under operating conditions is usually associated with a continuous generation of new dangling bonds on the semiconductor surface caused by energetic carriers. Our bias-temperature stress data have shown the hydrogen present in the bulk of the overlying amorphous silicon layer 50 can behave as a hydrogen reservoir to continuously rehydrogenate such newly-generated dangling bonds and thereby maintain the low leakage of the PN junction and increase the operational life expectancy of the PN junction.

The present novel invention is an effective passivation technique for neutralizing the dangling bonds adjacent an underlying PN junction, thereby reducing the number of recombination/regeneration centers which affect the operating performance of the PN junction. Since all the hydrogen escapes the dangling bonds at temperatures greater than about 550° C., the amorphous silicon coating should subsequently be kept below the dehydrogenation temperature of about 450° C. We have discovered that such a hydrogenated coating disposed over a PN junction provides new and unexpected improvements in reducing significantly the leakage current, "sharpening" the breakdown voltage, and improving the operating life expectancy of the PN junction.

What is claimed is:

1. A method of passivating a PN junction which extends to a surface of a crystalline semiconductor substrate comprising coating said surface with a layer of hydrogenated amorphous silicon which contains between about 5 and about 50 atomic percent of hydrogen with said layer extending over and directly contacting said surface at said PN junction.

2. A method as recited in claim 1 wherein said coating step is performed by decomposing silane (SiH$_4$).

3. A method as recited in claim 2 wherein said decomposing step is performed by utilizing a glow discharge in silane induced by a capacitively-coupled rf system.

4. A method as recited in claim 3 wherein said decomposing step is performed at a temperature below about 450° C. and at a pressure between about 0.1 Torr and about 5 Torr.

5. A method as recited in claim 1 wherein said layer of hydrogenated amorphous silicon has a thickness between about 0.01 $\mu$m and about 1 $\mu$m.

6. A method as recited in claim 1 wherein said semiconductor substrate is silicon and wherein said layer of hydrogenated amorphous silicon comprises one or more of the silicon hydride phases selected from the group consisting of Si:H, Si:H$_2$, and Si:H$_3$.

7. A method of passivating a PN junction which is within a body of crystalline semiconductor material and which extends to a surface of said body comprising the steps of diposing said body in a reaction chamber, generating a glow discharge within said chamber while maintaining said chamber under a vacuum, conducting a flow of a gaseous silicon-hydrogen compound into said chamber to effect decomposition of the compound by the glow discharge, and depositing directly on said surface of the body at the PN junction a layer of hydrogenated amorphous silicon containing between about 5 and about 50 atomic percent of hydrogen.

8. A method in accordance with claim 7 in which the gaseous silicon-hydrogen compound is silane ($SiH_4$).

* * * * *